(12) United States Patent
Hishiya et al.

(10) Patent No.: US 8,181,769 B2
(45) Date of Patent: May 22, 2012

(54) WORKPIECE TRANSFER MECHANISM, WORKPIECE TRANSFER METHOD AND WORKPIECE PROCESSING SYSTEM

(75) Inventors: Katsuyuki Hishiya, Oshu (JP); Kiichi Takahashi, Oshu (JP); Haruoki Nakamura, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 665 days.

(21) Appl. No.: 12/285,778

(22) Filed: Oct. 14, 2008

(65) Prior Publication Data

US 2009/0101472 A1 Apr. 23, 2009

(30) Foreign Application Priority Data

Oct. 19, 2007 (JP) ................. 2007-272625

(51) Int. Cl.
*B65G 29/00* (2006.01)
*B65G 1/133* (2006.01)
*B65G 57/03* (2006.01)
*G06F 17/30* (2006.01)

(52) U.S. Cl. ................. 198/474.1; 414/749.1; 414/793.5

(58) Field of Classification Search .......... None
See application file for complete search history.

(56) References Cited

U.S. PATENT DOCUMENTS

| 4,951,601 A | * | 8/1990 | Maydan et al. | 118/719 |
| 5,244,343 A | * | 9/1993 | Lockert | 414/797 |
| 6,454,332 B1 | * | 9/2002 | Govzman et al. | 294/185 |

FOREIGN PATENT DOCUMENTS

| JP | 8-279546 | 10/1996 |
| JP | 9-213647 | 8/1997 |
| JP | 11-274267 | 10/1999 |
| JP | 2002-76089 | 3/2002 |
| JP | 2003-37148 | 2/2003 |
| JP | 2005-286019 | 10/2005 |
| JP | 9-306975 | 11/2005 |
| JP | 2005-311306 | 11/2005 |

OTHER PUBLICATIONS

Japanese Office Action issued on Jun. 7, 2011 for Application No. 2007-272625 with English translation.

* cited by examiner

*Primary Examiner* — Kavel Singh
(74) *Attorney, Agent, or Firm* — Smith, Gambrell & Russell, LLP

(57) ABSTRACT

A workpiece transfer mechanism 76 transfers workpieces W to a workpiece boat 40 having ringlike tables 86. The transfer mechanism 76 includes a fork main body 78 being movable forward and rearward with the workpiece W placed thereon; stopper members 94 provided at the end portion of the fork main body 78; clamp means 96 provided on the proximal end side of the fork main body 78 and having a pressing portion 102 coming into contact with the circumferential edge of the workpiece W and pressing the workpiece W toward the stopper member 94 for clamping; and fork elevating means 80 for lifting and lowering the fork main body 78. When the workpieces W are transferred to a workpiece boat 40, the pressing portion 102 of the clamp means 96 is controlled so as not to be inserted into a gap between tables 86. Thus, although the pitch between the tables 86 is small, the pressing portion 102 of the clamp means 96 does not interfere with the workpiece boat 40.

10 Claims, 11 Drawing Sheets

(12) United States Patent US 8,181,769 B2

WORKPIECE TRANSFER MECHANISM, WORKPIECE TRANSFER METHOD AND WORKPIECE PROCESSING SYSTEM

CROSS REFERENCE TO RELATED APPLICATION

The present patent application benefits from Japanese Patent Application JP 2007-272625 filed in the Japanese Patent Office on Oct. 19, 2007, the entire contents of which are incorporated herein by reference.

BACKGROUND OF THE INVENTION

The present invention relates to a processing system, a workpiece transfer mechanism, and a workpiece transfer method in which workpieces such as semiconductor wafers from a storage box for storing the workpieces are transferred to a workpiece boat in a workpiece transfer area for heat treatment.

During manufacture of semiconductor integrated circuits such as ICs, LSIs, etc., in general, semiconductor wafers are repeatedly subjected to various processing such as deposition, oxidizing diffusion, etching and the like. In order to perform each processing, the semiconductor wafers needed to be transferred between corresponding devices.

In this case, a plurality of, e.g. 25, semiconductor wafers are transferred while stored in a storage box. Known storage boxes of this type include one such as a cassette transferred while opened to the atmosphere; and another one such as FOUP (trade mark) in which a box is hermetically sealed by an opening-closing lid and filled with an inert gas atmosphere such as a $N_2$ gas atmosphere, or with a clean air atmosphere in order to prevent particles or natural-oxidized films from adhering to semiconductor wafers (see JP-A-8-279546, 9-306975, and 11-274267).

For example, a batch-type processing system for handling the storage box mentioned above generally includes a box transfer area in which the storage box is transferred by a transfer mechanism; and a workpiece transfer area in which semiconductor wafers are transferred from the storage box to a wafer boat or the like for heat treatment (see e.g. JP-A-2002-76089, 2003-37148, and 9-213647). Both the areas are isolated from each other by a partition wall having an opening gate that can be opened and closed to transfer the wafers therebetween. The workpiece transfer area in which the workpieces are transferred while being in a bare state may be brought into an inert gas, e.g. nitrogen atmosphere, or into a clean air atmosphere in order to prevent a natural-oxidized film or the like from adhering to the wafer surfaces.

In the workpiece transfer area, the wafers in the storage box storing e.g. 25 wafers as mentioned above are transferred by use of a wafer transfer mechanism to a wafer boat, a workpiece boat, made of quartz or the like. This can hold a plurality of, e.g. about 50 to 150, wafers in a multistage manner at equal pitches or intervals. After the heat treatment for the wafers has been completed, the wafer is transferred from the wafer boat to the storage box by use of the wafer transfer mechanism reversely to the above in a similar manner.

The known wafer boats made of quartz and generally used in longitudinal thermal treatment equipment include so-called ladder-type wafer boats and so-called ring-type wafer boats (see JP-A-9-213647). Among them, the ladder-type wafer boat is such that struts constituting the wafer boat are formed with wafer support grooves for supporting the edges of wafers. The ring-type wafer boat is such that ringlike tables are spanned between struts in a multistage manner and formed with support claws for supporting the edges of the wafers. Recently, the ring-type wafer boats have tended to be frequently used because of satisfactory gas-flow controllability and relatively satisfactory in-plane uniformity of film thickness.

A transfer mechanism for transferring wafers at high-speed is proposed to meet the request for an improvement in throughput. Specifically, the transfer mechanism proposed has a fork provided with a device for clamping a wafer and transfers the wafer at high speed while clamping the wafer so as not to be displaced on the fork (see e.g. JP-A-2005-286019).

Now, a description is given of a conventional method for transferring wafers to a ring-type wafer boat by use of a wafer transfer mechanism having a clamp device with reference to FIG. 13. Referring to FIG. 13, the wafer boat 2 includes a plurality of ringlike tables 4. The tables 4 are provided on struts not shown so as to be vertically spaced from each other at predetermined pitches P1 in a multistage manner. Each table 4 is provided on an upper surface with e.g. three support claws 6 (only two support claws are shown in the figure). A semiconductor wafer W is placed on the support claws 6.

The fork 8 of the wafer transfer mechanism has a bifurcate end portion and is configured to be movable forward, rearward, upward, and downward. The wafer W is supported on the fork 8. The fork 8 is provided with a stopper member 10 at a distal end. On the other hand, the fork 8 is provided on a proximal end side with clamp means 14 with a pressing portion 12 configured to be movable forward and rearward by e.g. an air cylinder. The wafer W is clamped between the stopper member 10 and the pressing portion 12 so as to be conveyed at high speed in such a state.

For example, if the wafer W on the fork 8 is to be transferred to the wafer boat 2, the wafer W is put and clamped between the pressing portion 12 and the stopper member 10. The fork 8 is inserted between the tables 4 in this state and the pressing portion 12 is slightly moved rearward to release the clamping. The fork 8 is slightly lowered in this state to transfer the wafer W on the fork 8 onto the support claws 6 of the table 4 and thereafter moved rearward.

Incidentally, such batch-type thermal treatment equipment is demanded to further improve throughput. This needs to increase the number of wafers that can be placed on the wafer boat 2 at once. In this case, it is conceivable to increase the height of the wafer boat 2. However, the height of the entire thermal treatment equipment is increased, which undesirably necessitates significant design changes. In contrast, it is conceivable that a pitch P1 between the tables 4 is reduced without changing the height of the wafer boat 2 to increase the number of wafers mountable thereon at once.

If the height of the entire wafer boat 2 is e.g. 1000 mm, 50 wafers W (in terms of finished wafers) can be mounted on the wafer boat 2 at a pitch P1 of 16 mm. If the pitch P1 of the wafer boat 2 is reduced to 11.5 mm, 75 wafers W (in terms of finished wafers) can be mounted so that the number of mountable wafers W can be increased by as many as 25 wafers. Incidentally, the wafer W has a thickness of about 0.7 mm.

In this case, however, the various portions of the wafer transfer mechanism mentioned above are each designed to have significantly marginal dimensions. For this reason, if the wafer W is mounted in the wafer boat 2 with a reduced pitch P1, then the reduced pitch P1 poses a problem in that the pressing portion 12 collides or interferes with an edge portion 4A of a table right above the table 4 on which the wafer W is placed.

In this case, it is conceivable that the thickness or height of the pressing portion 12 is set to such a low level as not to interfere with the upper table. However, it is difficult to change design as mentioned above because the various portions of the wafer transfer mechanism are designed to have significantly marginal dimensions as described above.

SUMMARY OF THE INVENTION

The present invention has been made to solve such a problem and it is an object of the present invention to provide a workpiece transfer mechanism, a workpiece transfer method, and a workpiece processing system that can perform quick workpiece transfer operation while preventing a pressing portion of clamp means for clamping a workpiece from interfering with a workpiece boat even if a pitch between tables of the workpiece boat is reduced.

The present invention is characterized, in a workpiece transfer mechanism for transferring a workpiece to or from a workpiece boat, the workpiece boat having ringlike tables arranged at predetermined pitches to each receive the workpiece placed thereon, by including: a fork main body being movable forward and rearward with the workpiece placed thereon; a stopper member provided at an end portion of the fork main body and coming into contact with a circumferential edge of the workpiece; clamp means provided on a proximal end side of the fork main body and having a pressing portion, the pressing portion being movable forward and rearward relative to the fork main body along a longitudinal direction of the fork main body and coming into contact with the circumferential edge of the workpiece and pressing the workpiece toward the stopper member for clamping; and fork elevating means for lifting and lowering the fork main body along the workpiece boat; and in that when the workpiece is transferred to or from the workpiece boat, the pressing portion of the clamp means is controlled not to be inserted in a gap between the ringlike tables.

As described above, when the workpiece is transferred to the workpiece boat, the pressing portion of the clamp means is controlled not to be inserted in the gap between the tables of the workpiece boat. Consequently, although the pitch between the tables of the workpiece boat is small, the workpiece transfer operation can be performed with rapidity while allowing the pressing portion of the clamp means for clamping a workpiece not to interfere with the workpiece boat.

In this case, for example, the end portion of the fork main body is formed to have bifurcate portions and the bifurcate portions are each provided with the stopper member. For example, a plurality of the fork main bodies are vertically parallelized and each provided with the stopper member and with the clamp means. In addition, for example, a transfer control section for controlling operation of the transfer mechanism is further provided and the transfer control section controls the fork main body and the clamp means so that the pressing portion of the clamp means is not inserted into the gap between the ringlike tables.

The present invention is characterized, in a workpiece transfer method of transferring a workpiece to or from a workpiece boat by use of a workpiece transfer mechanism, the workpiece boat having ringlike tables arranged at predetermined pitches to each receive the workpiece placed thereon, the workpiece transfer mechanism including: a fork main body being movable forward and rearward with the workpieces placed thereon; a stopper member provided at an end portion of the fork main body and coming into contact with a circumferential edge of the workpiece; clamp means provided on a proximal end side of the fork main body and having a pressing portion, the pressing portion being movable forward and rearward relative to the fork main body along a longitudinal direction of the fork main body and coming into contact with the circumferential edge of the workpiece and pressing the workpiece toward the stopper member for clamping; and fork elevating means for lifting and lowering the fork main body along the workpiece boat; by including: a placing process for going and placing the workpiece placed on the fork main body onto the workpiece boat; a receiving process for going and getting the workpiece placed on the workpiece boat by use of the fork main body; and in that in the placing process and in the receiving process, the pressing portion of the clamp means is controlled so as not to be inserted into the gap between the ringlike tables.

In this case, for example, the placing process includes: a holding step in which the workpiece is pressed and clamped by the pressing portion of the clamp means while being placed on the fork main body; a placing-time approaching step in which the fork main body is moved forward toward the workpiece boat and the pressing portion is moved rearward to a position not interfering with the table immediately before the pressing portion reaches the gap between the tables of the workpiece boat; a placing-time transfer step in which the fork main body is lowered to place the workpiece on the fork main body, onto the table; and a placing-time moving-away step in which the fork main body is moved rearward; and the receiving process includes: a receiving-time approaching step in which the fork main body is moved forward toward the workpiece boat and the pressing portion is moved rearward to a position not interfering with the table immediately before the pressing portion of the clamp means reaches the gap between the tables; a receiving-time transfer step in which the fork main body is lifted to receive thereon the workpiece on the table for transfer; and a receiving-time moving-away step in which when the fork main body is moved rearward by a predetermined distance, the pressing portion is moved forward so that the pressing portion and the stopper member press and clamp the workpiece.

For example, the table is provided thereon with a support claw on which the workpiece is placed, and the placing-time transfer step includes: a first lowering step in which the fork main body is lowered to a height-level of the support claw; and a second lowering step in which after the first lowering step, the fork main body is moved forward by a slight distance while further being lowered.

In addition, for example, a foremost position where the fork main body is moved forward in the receiving-time approaching step of the receiving process is set to coincide with a foremost position the fork main body reaches in the second lowering step of the placing-time transfer step.

For example, the pressing portion of the clamp means is moved forward or rearward with the fork main body stopped. In addition, for example, the pressing portion of the clamp means is moved forward or rearward with the fork main body being moved.

The present invention is characterized, in a workpiece processing system in which a plurality of workpieces are taken out of a storage box storing the workpieces therein and the workpieces are subjected to heat treatment, by including a longitudinal processing unit for subjecting the workpieces to heat treatment; a workpiece transfer area provided at a lower portion of the processing unit and partitioned from the circumference by a partition wall; a workpiece boat provided in the workpiece transfer area and having ringlike tables arranged at predetermined pitches to each receive the workpiece placed thereon; boat elevating means, provided in the workpiece transfer area, for lifting the workpiece boat and loading or unloading the workpiece boat into or from the inside of the processing unit; and a workpiece transfer mechanism, provided in the workpiece transfer area, for transferring the workpiece between the workpiece boat and the storage box put on a transfer stage provided at the partition wall; in that the workpiece transfer mechanism includes: a fork main body being movable forward and rearward with the workpieces placed thereon; a stopper member provided at an end portion of the fork main body and coming into contact with a circumferential edge of the workpiece; clamp means provided on a proximal end side of the fork main body and having a pressing portion, the pressing portion being movable forward and rearward relative to the fork main body along a longitudinal direction of the fork main body and coming into contact with the circumferential edge of the workpiece and pressing the workpiece toward the stopper member for clamping; and fork elevating means for lifting and lowering the fork main body along the workpiece boat; and in that when the workpiece is transferred to or from the workpiece boat, the pressing portion of the clamp means is controlled not to be inserted into the gap between the ringlike tables.

The present invention is characterized, in a storage medium storing a computer-readable program used by a workpiece transfer method for transferring a workpiece by use of a workpiece transfer mechanism, in that the workpiece transfer mechanism includes: a fork main body being movable forward and rearward with the workpieces placed thereon; a stopper member provided at an end portion of the fork main body and coming into contact with a circumferential edge of the workpiece; clamp means provided on a proximal end side of the fork main body and having a pressing portion being movable forward and rearward relative to the fork main body along a longitudinal direction of the fork main body and coming into contact with the circumferential edge of the workpiece and pressing the workpiece toward the stopper member for clamping; and fork elevating means for lifting and lowering the fork main body along the workpiece boat; in that the workpiece transfer method includes: a placing process for going and placing the workpiece placed on the fork main body, onto the workpiece boat; and a receiving process for going and getting the workpiece placed on the workpiece boat by use of the fork main body; and in that in the placing process and in the receiving process, the pressing portion of the clamp means being controlled so as not to be inserted into the gap between the ringlike tables.

The workpiece transfer mechanism, the workpiece transfer method, and the workpiece processing system according to the present invention can exhibit the following superior functions and effects. When the workpiece is transferred to the workpiece boat, the pressing portion of the clamp means is controlled not to be inserted into the gap between the tables of the workpiece boat. Therefore, although the pitch between the tables of the workpiece boat is small, the workpiece transfer operation can be performed with rapidity while the pressing portion of the clamp means for clamping the workpiece is not allowed to interfere with the workpiece boat.

DETAILED DESCRIPTION OF THE PREFERRED EMBODIMENTS

A detailed description will hereinafter be given of a preferred embodiment of a workpiece transfer mechanism, a workpiece transfer method, and a workpiece processing system according to the present invention with reference to the accompanying drawings.

Figure 1:
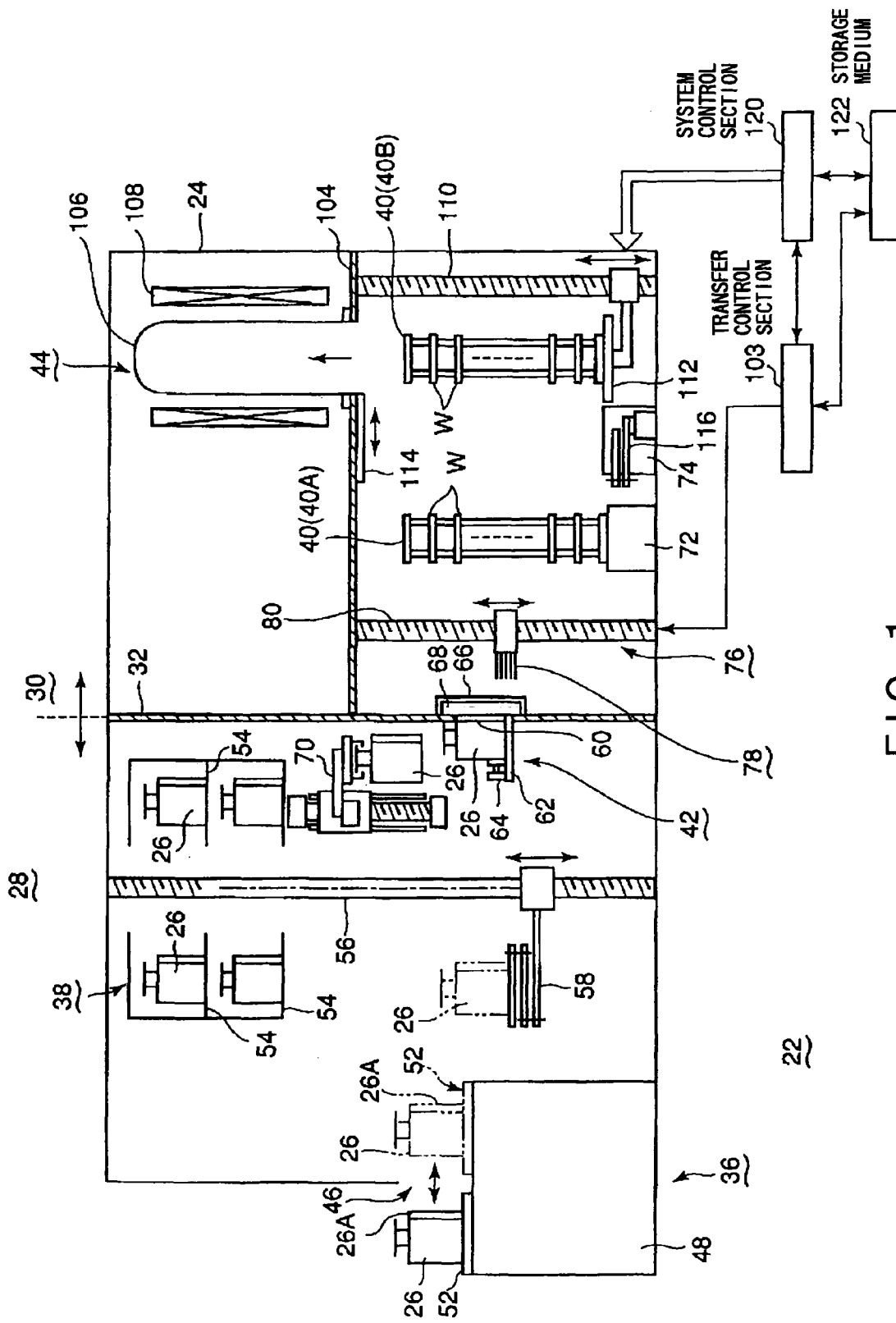
FIG. 1 is a schematic diagram of a workpiece processing system according to an embodiment of the present invention.
Figure 2:
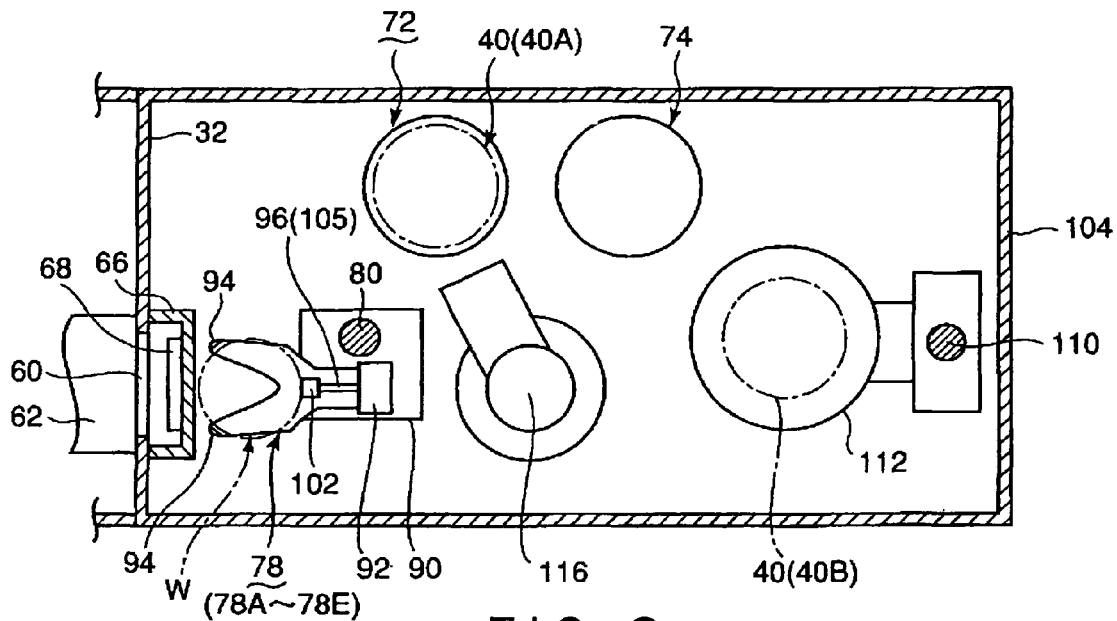
FIG. 2 is a plan view illustrating arrangement positions of constituent members in a workpiece transfer area by way of example.

Referring to FIGS. 1 and 2, a workpiece processing system 22 is enclosed by a housing 24 made of e.g. stainless steel and entirely functioning as a partition wall. The housing 24 is internally sectioned into a storage box conveying area 28 used to convey a storage box 26 and a workpiece transfer area 30 for transferring semiconductor wafers W, workpieces. The storage box conveying area 28 and the workpiece transfer area 30 are sectioned by a partition wall 32.

Incidentally, the wafer W used here has a diameter of 300 mm but is not limited to this diameter. The wafer W with a diameter of 8 or 6 inches may be used. The storage box 26 internally supports a plurality of, e.g. 25, wafers in a stagelike manner and is hermetically sealed by an opening-closing lid 26A. In addition, the storage box 26 is internally filled with an inert gas, such as $N_2$ gas, atmosphere, or with a clean air atmosphere.

Clean air downflow passes through inside of the storage box conveying area 28. The workpiece transfer area 30 is filled with an inert gas, such as $N_2$ gas, atmosphere. Incidentally, clean air may be allowed to flow inside of this area 30.

This processing system 22 includes a carrying in/out port 36, a stocker 38, a transfer stage 42, and a processing unit 44. Among them, the carrying in/out port 36 is used to carry the storage box 26 in and out of the processing system 22. The stocker 38 is used to temporarily store the storage box 26. The transfer stage 42 transfers semiconductor wafers W between the storage box 26 and the workpiece boat 40. The processing unit 44 applies a predetermined thermal treatment to the semiconductor wafers W transferred and held on the workpiece boat 40.

The housing 24 is formed in one surface with a normally-opened box carrying in/out port 46 on the carrying in/out port 36. Incidentally, the box carrying in/out port 46 is configured to be openable and closable by an opening-closing door in some cases. An external table 48 is provided at the box carrying in/out port 46 to place thereon the storage box 26 conveyed from the outside. The external table 48 is installed to straddle the box carrying in/out port 46 inwardly and outwardly. A slide plate 52 is provided on the external table 48 so as to be slidable with respective thereto. In this way, the storage box 26 can be moved while being put on the slide plate 52.

On the other hand, the stocker portion 38 is disposed at an upper portion inside the storage box conveying area 28. The stocker portion 38 is provided with shelves 54 arranged, for example, at two rows and two stages, as shown in the figure to temporarily place and store the storage boxes 26 thereon. Incidentally, the number of shelves 54 is not particularly restrictive. In actual, many shelves 54 are more provided than described above.

An elevator 56 is provided on the side of each of the two shelves 54 so as to extend upright. The elevator 56 is provided with a box conveying arm 58 which can horizontally be moved forward and rearward and turned. Thus, the box conveying arm 58 is bent and stretched, and lifted and lowered to thereby convey the storage box 26 between the carrying in/out port 36 and the stocker portion 38 while holding the storage box 26.

At the transfer stage 42, the partition wall 32 sectioning both the areas 28, 30 is formed with an opening 60 slightly larger than the opening-closing lid 26A of the storage box 26. A rack 62 is horizontally provided at the opening 60 on the side of the storage box conveying area 28. The storage box 26 can be placed on the rack 62.

An actuator 64 is provided on one side of the rack 62 (on the side opposed to the opening 60) so as to press and bias the storage box 26 placed on the rack 62 toward the partition wall 32. The actuator 64 brings the lip of the opening of the storage box 26 into generally hermetical contact with the lip of the opening 60 of the partition wall 32 with the opening-closing lid 26A of the storage box 26 facing the opening 60. Alternatively, the actuator 64 may press the storage box 26 from above for fixation.

An opening-closing door 66 for opening and closing the opening 60 is provided at the opening 60 on the side of the workpiece transfer area 30 so as to be transversely slidable. Incidentally, the opening-closing door 66 is provided so as to be vertically slidable in some cases. A lid opening-closing mechanism 68 is provided on the opening-closing door 66 to open and close the opening-closing lid 26A of the storage box 26 (see FIG. 2).

A standby box conveying arm 70 is installed in the storage box conveying area 28 to allow the storage box 26 to stand by near the opening 60. The standby box conveying arm 70 receives from the box conveying arm 58 the storage box 26 storing wafers W to be processed next, standing by for a predetermined time, and then places the storage box 26 on the transfer stage 42. Incidentally, the standby box conveying arm 70 is not installed in some cases. In such a case, the box conveying arm 58 transfers the storage box 26 onto the transfer stage 42.

On the other hand, two boat pedestals on which the workpiece boats 40 such as wafer boats are placed, i.e., a transfer boat pedestal 72 and a standby boat pedestal 74, are installed in the workpiece transfer area 30. A workpiece transfer mechanism 76 characterizing the present invention is installed between the transfer stage 42 and the transfer boat pedestal 72.

The workpiece transfer mechanism 76 includes a fork main body 78 designed to be movable forward and rearward and turnable in a horizontal direction; and fork elevating means 80 such as an elevator for vertically moving the fork main body 78. For example, a ball screw or the like can be used as the fork elevating means 80. Incidentally, the structure of the transfer mechanism 76 can be detailed later.

Thus, the transfer mechanism 76 is drivingly bent and stretched, turned, and lifted and lowered to thereby transfer the wafers W between the storage box 26 on the rack 62 and the workpiece boat 40 on the transfer boat pedestal 72. Concerning the workpiece boat 40, a plurality of, e.g., two, workpiece boats 40A, 40B are provided and the workpiece boats 40A, 40B are alternately used. Incidentally, the workpiece boat 40 to be provided may be one, three or more. If the single workpiece boat 40 is provided, the boat pedestals 72, 74 are not provided and the wafers W are transferred between the rack 62 and the workpiece boat on a cap described later.

Figure 3:
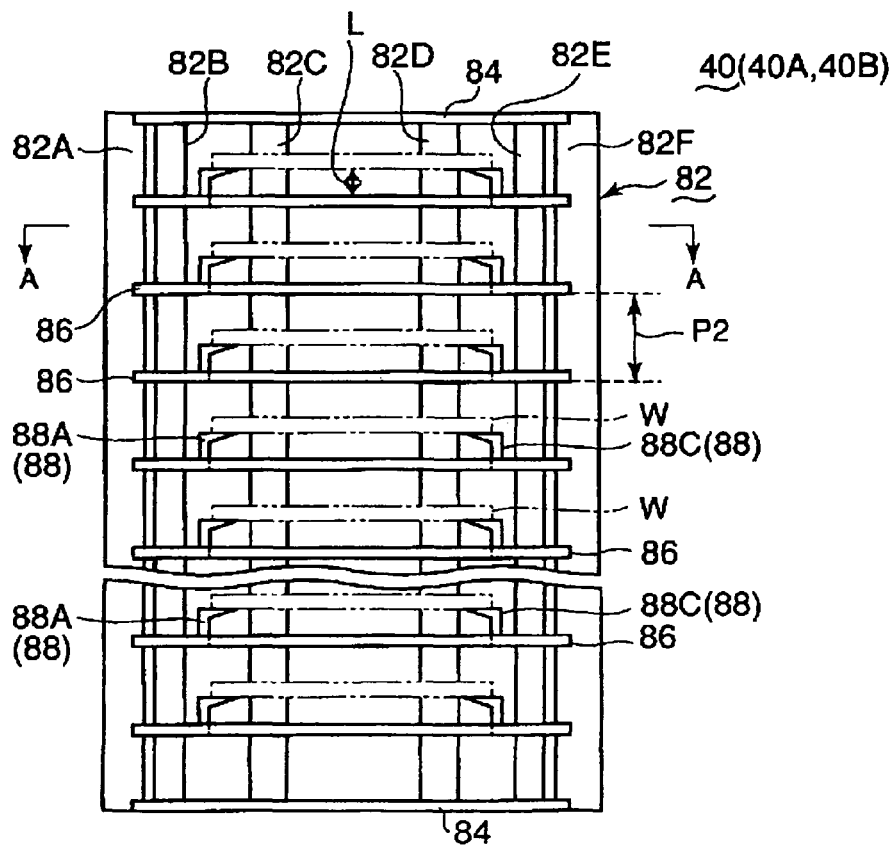
FIG. 3 is a lateral view of a workpiece boat.
Figure 4:
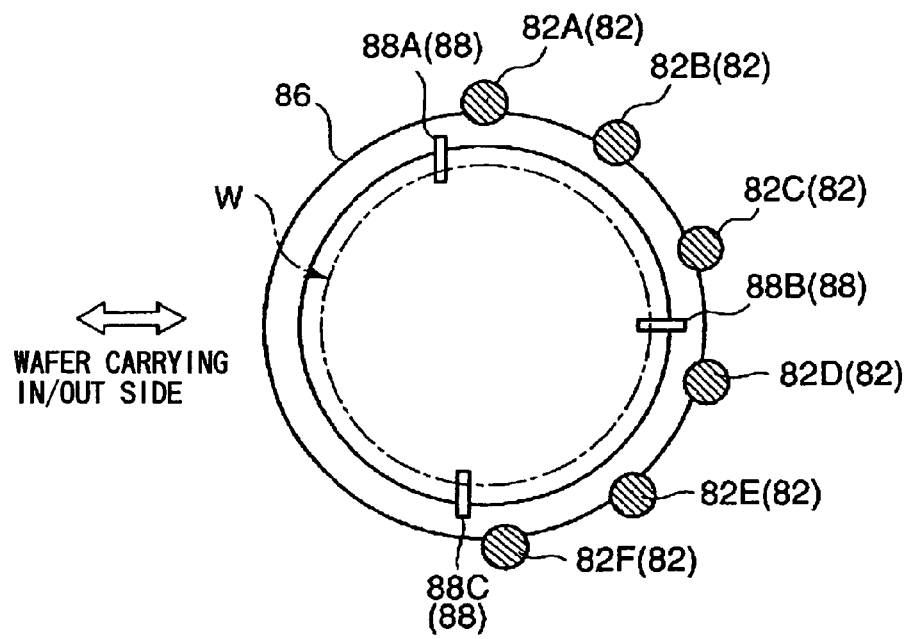
FIG. 4 is a cross-sectional view taken along line A-A of FIG. 3.
Figure 5:
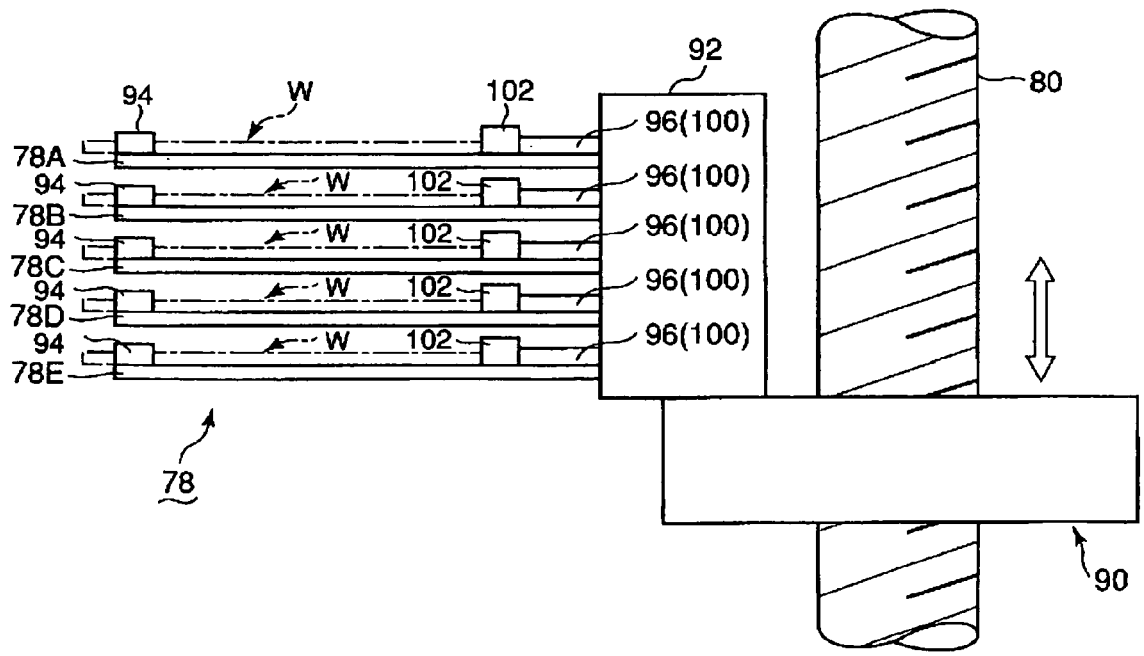
FIG. 5 illustrates a workpiece transfer mechanism by way of example.
Figure 6:
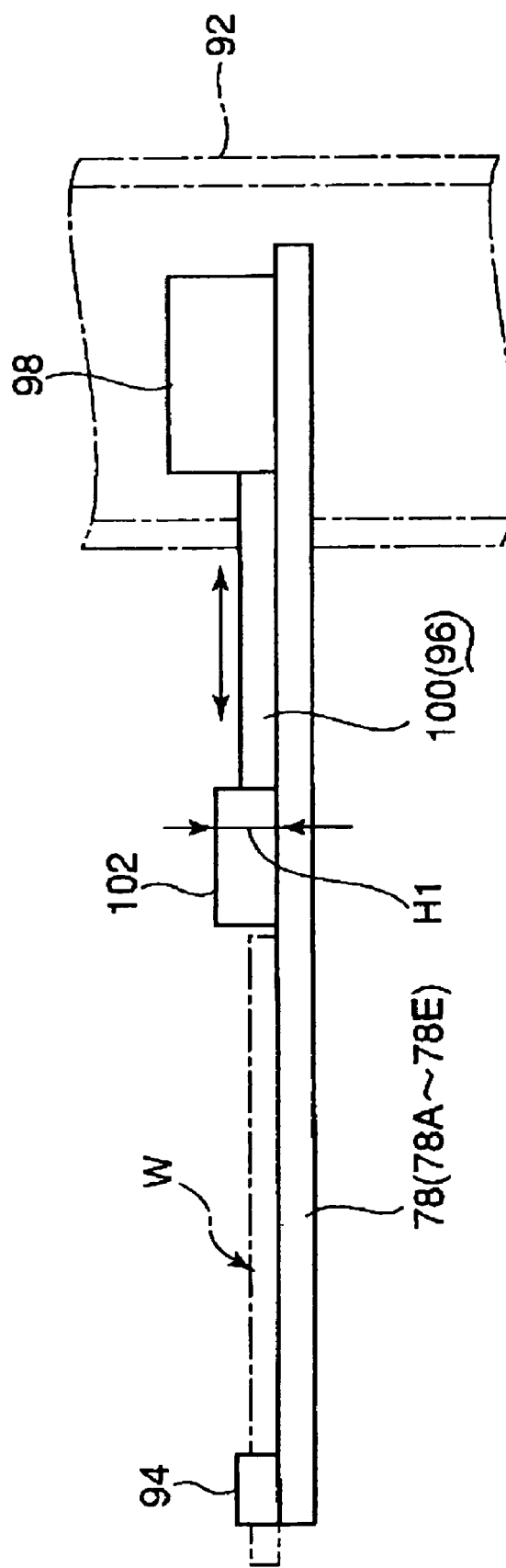
FIG. 6 illustrates a fork main body of the workpiece transfer mechanism.

The workpiece boat 40 is entirely made of a heat-resistant material, e.g., quartz. Specifically, as shown in FIGS. 3 and 4, the workpiece boat 40 includes e.g. six struts 82, whose upper and lower ends are secured by corresponding holding plates 84. The six struts 82 are arranged on a generally semicircular side of the holding plates 84 so as to be spaced from each other at predetermined intervals. A side opposed to the generally semicircular side is a carrying in/out side through which the wafers W are carried in and out of the workpiece boat 40 (see FIG. 4). The six struts 82 (specifically, struts 82A, 82B, 82C, 82D, 82E, and 82F) are arranged on a generally semicircular arc at generally equal intervals in the exemplified figure. However, the arrangement intervals and positions of the struts 82A-82F are not limited to the embodiment shown in FIG. 4. Needless to say, the number of the struts is not limited to six.

Figure 13:
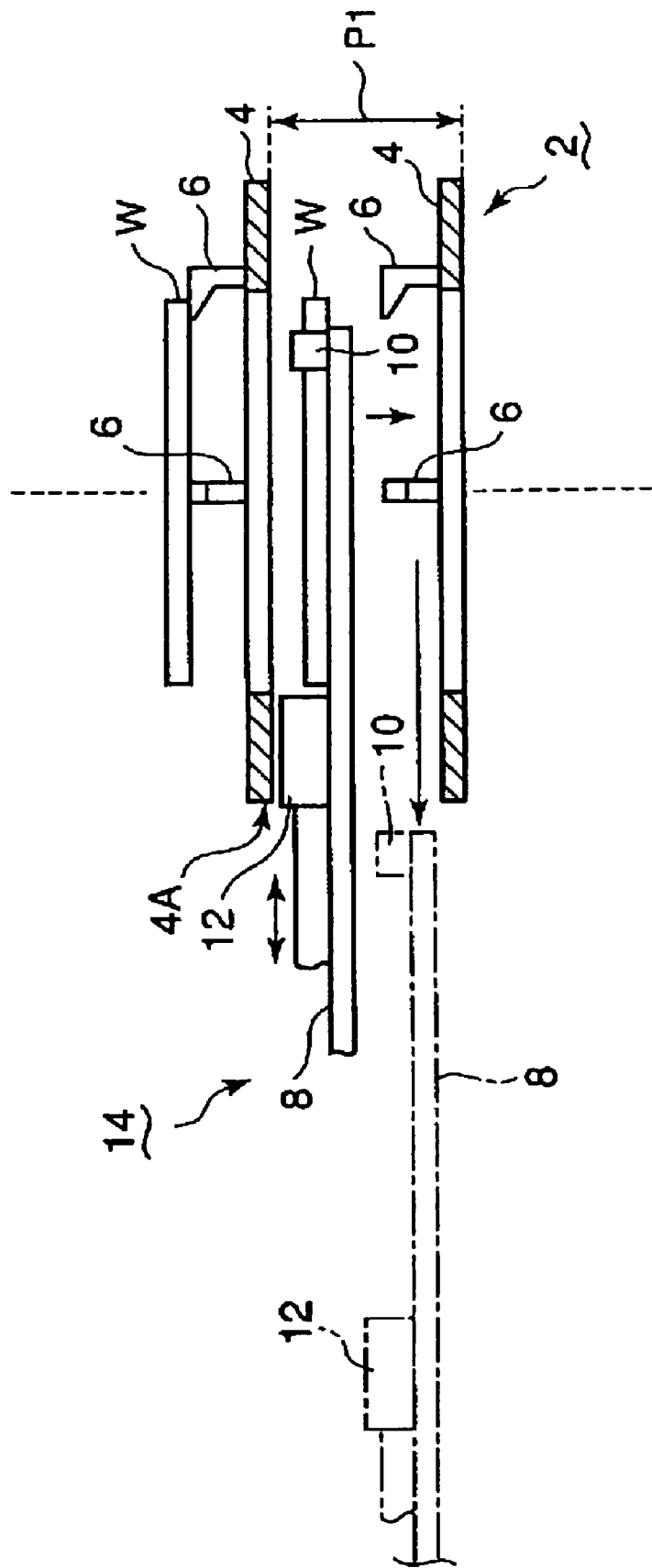
FIG. 13 is a diagram for assistance in explaining a conventional wafer transfer method in which wafers are transferred to a ring-type wafer boat using a wafer transfer mechanism with a clamp mechanism.

As shown in FIG. 3, a large number of (a plurality of) horizontally arranged ringlike tables 86 are mounted and secured to the struts 82 at predetermined pitches P2 in the longitudinal direction of the struts 82. This pitch P2 is set to e.g. about 11.5 mm, so that about 75 finished wafers in total can be placed in the workpiece boat 40. This pitch P2 thus set is smaller than e.g. 16 mm which is the pitch P1 of the conventional workpiece boat (see FIG. 13).

The ringlike table 86 is provided on an inner circumferential edge portion with three support claws 88 (88A, 88B, 88C) which slightly project upward therefrom and also radially inwardly thereof. The wafer W is placed on and supported by the support claws 88 by the lower surface of the circumferential edge of the wafer W coming into contact therewith.

The attachment positions of the three support claws 88A, 88B, and 88C are as below. Among the three support claws 88A-88C, the two support claws 88A, 88C are located to be slightly spaced from the two struts 82A, 82F toward the wafer carrying in/out side, the two struts 82A, 82F being arranged in the generally diametrical direction. The remaining support claw 88B is located at an intermediate position between the two struts 82C, 82D located at the center of the six struts 82. With such a configuration, the wafer W is supported at the three points. In this case, a distance L1 between the upper surface of the table 86 and the lower surface of the wafer W supported by the support claws 88A-88C is set to e.g. about 4.0 mm.

Referring to FIGS. 5, 6, 7A, and 7B, the fork elevating means 80 of the transfer mechanism 76 is provided with a base 90 lifted and lowered by the fork elevating means 80. A fork base 92 is provided on the base 90 so as to be slidably movable and turnably movable. A plurality of the fork main bodies 78 are attached to the fork base 92 so as to be vertically parallelized. The fork main bodies 78 can individually be moved forward and backward in the horizontal direction while each placing the wafer W thereon. In this case, the number of the fork main bodies 78 thus provided is five (fork main bodies 78A, 78B, 78C, 78D, and 78E), so that up to five wafers W can be transferred at once.

Figure 7A:
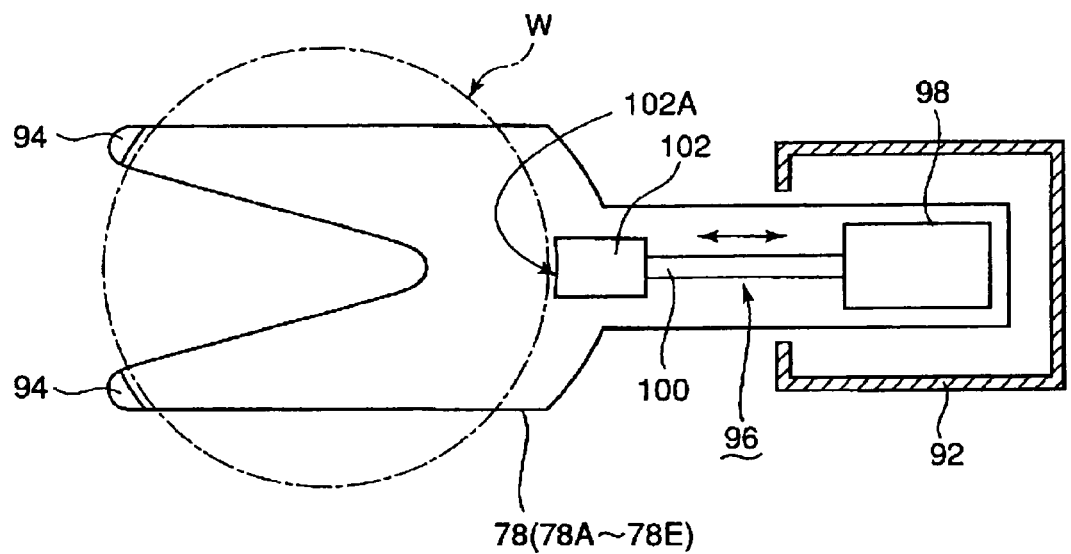
FIGS. 7A and 7B are diagrams for assistance in explaining operation of the fork main body.
Figure 7B:
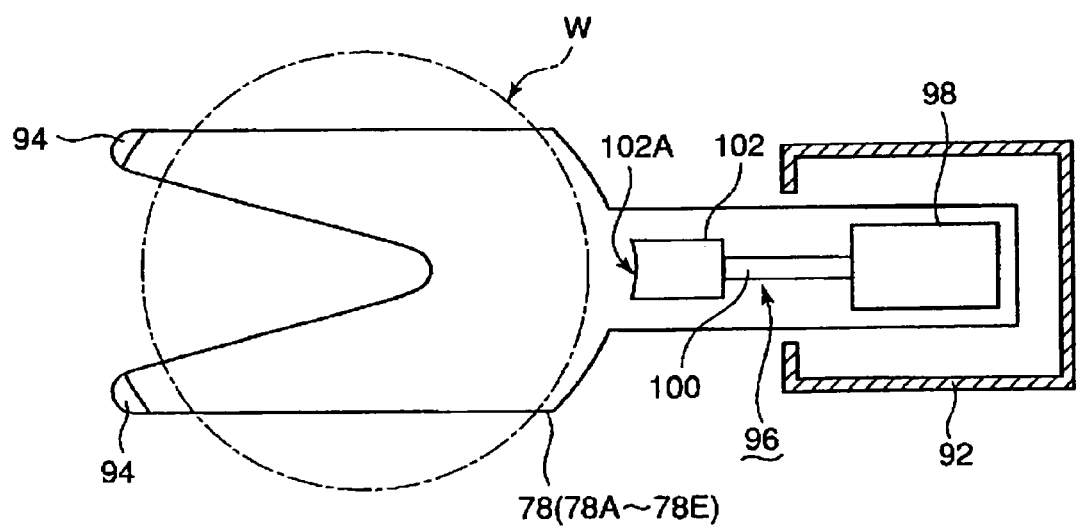

In the present embodiment, the end portion of each of the fork main bodies 78A-78E is bifurcate as shown in FIGS. 7A and 7B and is formed to slightly project upward. The end portion of each main body 78A-78E is provided with stopper members 94 each having an internal lateral surface formed as a curved surface extending along the circular arc of the edge of the wafer W. The stopper members 94 come into contact with the circumferential edge of the wafer W to hold the wafer W. In this case, the fork main bodies 78A-78E are made of e.g. a PEEK (registered trademark) resin and the stopper member 94 is made of e.g. a PEEK (registered trademark) resin.

The fork main bodies 78A-78E are each provided with clamp means 96 at a proximal end portion. As shown in FIGS. 7A, 7B, the clamp means 96 includes an actuator 98 such as e.g. an air cylinder or the like. An operation rod 100 of the actuator 98 is provided at an end with a pressing portion 102 having a predetermined height and coming into contact with the circumferential edge of the wafer W and pressing the wafer W. In this way, the pressing portion 102 can be moved forward and rearward. The front lateral surface 102A of the pressing portion 102 is formed as a curved surface extending along the circular arc of the edge of the wafer W.

The actuator 98 is actuated from the state as shown in FIG. 7B to move the pressing portion 102 forward. This presses the wafer W toward the stopper member 94 as shown in FIG. 7A to grip the wafer W between the pressing portion 102 and the stopper member 94 for clamping and rendering it immovable.

In this case, the fork main bodies 78A-78E and the clamp means 96 are controlled to be movable entirely cyclically or individually. The pressing portion 102 is made of e.g. a PEEK (registered trademark) resin and has a height H1 (see FIG. 6) of e.g. about 4.0 mm.

The stroke of the operation rod 100 of the clamp means 96 is set at e.g. about 20 mm. The entire operation of the transfer mechanism 76 is controlled by a transfer control section 103 (see FIG. 1) composed of e.g. a computer. Further, the transfer mechanism 76 is provided with a resin-made flexible air tube (not shown) for supplying or discharging pressurized gas used to drive the fork main bodies 78A-78E, the fork base 92 and the like.

Returning to FIG. 1, a processing unit 44 composed of a longitudinal heat-treating furnace is disposed at an upper lateral side of the workpiece transfer area 30 while being supported by the base plate 104. The processing unit 44 includes a cylindrical treatment container 106 made of quartz. A cylindrical heater 108 is provided around the treatment container 106 to heat the wafers W in the treatment container 106. Thus, a large number of wafers W are subjected to predetermined heat treatments such as deposition and oxidizing diffusion.

In this case, wafer temperature is e.g. up to about 800 to 900 degrees C. (Celsius) although depending on the type of treatment. A cap 112 is disposed below the treatment container 106. The cap 112 is configured to be movable up and down by boat elevating means 110 such as an elevator.

For example, a ball screw or the like can be used as the boat elevating means 110. The cap 112 on which the workpiece boat 40 is placed is lifted so that the workpiece boat 40 can be loaded into the treatment container 106 from the lower end opening thereof. In this case, the lower end opening of the treatment container 106 can hermetically be closed.

A shutter 114 is slidably attached to a side of the lower end opening of the treatment container 106 so as to close the lower end opening when the workpiece boat 40 is unloaded and moved downward.

A boat transfer mechanism 116 is disposed close to the lowered cap 112 and both the boat pedestals 72, 74 so as to be bent and stretched and turnable. This boat transfer mechanism 116 can transfer the workpiece boat 40 between each of the boat pedestals 72, 74 and the cap 112 and between both the pedestals 72, 74.

Sideflow of clean air or inert gas such as $N_2$ gas or the like is constantly formed in the workpiece transfer area 30. This can keep the inside of the workpiece transfer area 30 clear and cool the inside of the workpiece transfer area 30 to lower atmosphere temperature.

Incidentally, the entire operation of the processing system 22 is controlled by a system control section 120 composed of e.g. a computer. Such entire operation includes, e.g., carrying in/out operation of the storage boxes 26 in the storage box conveying area 28; transfer operation of the wafers W in the workpiece transfer area 30; transfer operation of the workpiece boats 40; elevating operation of the workpiece boats 40; and heat-treating operation (deposition and the like) of the processing unit 44. In this case, the transfer control section 103 is subject to the system control section 120. A (computer-readable) program needed to control the system control section 120 and the transfer control section 103 is stored in a storage medium 122. This storage medium 122 is composed of e.g. a flexible disk, a CD (compact disc), a hard disk or a flash memory.

The operation of the processing system 22 configured as above is next described with reference to FIGS. 8A through 12.

The workpiece transfer area 30 is internally filled with an $N_2$ atmosphere by forming the sideflow of inert gas, e.g., $N_2$ gas in order to prevent a natural oxidized film from adhering to a wafer surface. In addition, the storage box conveying area 28 is internally filled with clean air by forming the downflow of clean air.

A description is first given of the overall flow of the semiconductor wafers W. On the side of the storage box conveying area 28, the storage box 26 conveyed from the outside of the processing system 22 is placed on the external table 48 with the opening-closing lid 26A thereof facing the box-carrying in/out port 46. The slide plate 52 on the external table 48 on which the storage box 26 is placed is moved forward. Thus, the storage box 26 is transferred into the storage box conveying area 28.

Next, the box conveying arm 58 is driven to go get the storage box 26 placed on the slide plate 52 and hold it. Further, the elevator 56 is driven to convey the storage box 26 to a predetermined position of the shelves 54 of the stocker 38 disposed at an upper portion inside the storage box conveying area 28 for temporarily storing it. At the same time, the box-conveying arm 58 goes get the storage box 26 that has temporarily been held on the shelf 54 and that has stored the wafers W to be processed. Then, the elevator 56 is driven to lower the storage box 26.

If the rack 62 of the transfer stage 42 is empty, the storage box 26 is transferred onto the rack 62 of the transfer stage 42. On the other hand, if another storage box 26 is set on the rack 62, the standby box conveying arm 70 grips the storage box 26 on the box-conveying arm 58 and conveys it to a position near the opening 60 for standby.

At this time, the opening-closing lid 26A of the storage box 26 on the rack 62 is made to face the opening-closing door 66. In addition, the storage box 26 is secured onto the rack 62 by being pressed and biased by the horizontal actuator 64 disposed on one side of the rack 62.

In this state, the lid opening-closing mechanism 68 is driven to remove the opening-closing door 66 of the opening 60 and the opening-closing lid 26A of the storage box 26 and slidably move them in a horizontal direction for example for evacuation. Next, the workpiece transfer mechanism 76 is driven to take out the wafers W stored in the storage box 26 by five at a time here and transfers them to the workpiece boat 40 set on the transfer boat pedestal 72.

In this case, if the number of the wafers stored in the workpiece boat 40 is 75 and the number of the wafer stored in the storage box 26 is 25, the wafers W are taken out of three storage boxes 26 for transfer. In this way, the wafers taken out of the three storage boxes 26 are processed as one batch processing.

After the transfer of the wafers W to the workpiece boat 40 is completed, the boat transfer mechanism 116 is then driven to place the workpiece boat 40 put on the transfer boat pedestal 72, on the cap 112 lowered to the lowest end. If the workpiece boat 40 that stores therein the heat-treated and unloaded wafers W is placed on the cap 112, the workpiece boat 40 is previously transferred onto the standby boat pedestal 74 by use of the boat transfer mechanism 116.

After the operation for transferring the workpiece boat 40 storing untreated wafers W onto the cap 112 is completed, the boat-elevating means 110 is driven to integrally lift the workpiece boat 40 and the cap 112 on which the workpiece boat 40 is placed. In this way, the workpiece boat 40 is led and loaded into the treatment container 106 of the processing unit 44 through the lower end opening thereof.

Next, the lower end opening of the treatment container 106 is hermetically sealed with the cap 112. In this state, the wafers W in the processing unit 44 are subjected to predetermined heat treatment such as e.g. deposition, oxidized diffusion and the like. In this case, the temperature of the wafers W reaches as high as 800 to 1000 degrees C. depending on the mode of heat treatment.

After the heat treatment for the predetermined time is completed as described above, the processed wafers W are taken out by performing the operation reverse to the above-mentioned operation. In other words, unloading is started to lower the workpiece boat 40 from the inside of the treatment container 106, thus completing the unloading.

In this case, when the unloading is started to start the lowering of the workpiece boat 40, the atmosphere in the workpiece transfer area 30 becomes a high-temperature state. For this reason, the fork main body 78 of the transfer mechanism 76 with less heat resistance is evacuated downward. The unloaded workpiece boat 40 is transferred onto the transfer boat pedestal 72 by the boat transfer mechanism 116 via the standby boat pedestal 74 or not via the standby boat pedestal 74, i.e., directly. The processed wafers W are cooled to some extent during this transfer.

The processed wafers W is transferred into an empty storage box 26 on the rack 62 of the transfer stage 42 from the workpiece boat 40 by use of the fork-elevating means 80 and the fork main body 78 attached to the transfer mechanism 76. After the operation of transferring the processed wafers W into the storage box 26 is completed, the opening-closing door 66 is attached to the opening 60. Further, the lid opening-closing mechanism 68 is driven to attach the opening-closing lid 26A held by the lid opening-closing mechanism 68 to the storage box 26.

Next, the box conveying arm 58 in the storage box conveying area 28 is driven to convey the storage box 26 to the outside of the processing system 22 via the box carrying in/out port 46 while temporarily storing or not storing it on the stocker 38.

While the box conveying arm 58 conveys the storage box 26 storing the processed wafers W therein, the standby box conveying arm 70 already having gripped an empty storage box 26 for standby sets it on the rack 62. At this time, operation of storing the processed wafers W in the storage box 26 is started.

In this case, for example, three empty storage boxes 26 are used. Thus, one batch processing for the wafers W is completed. The same operation is continuously repeated. Incidentally, the flow of the storage boxes 26 described above is merely exemplified and, needless to say, the invention is not limited to this flow.

A detailed description is next given of a placing process in which a workpiece is transferred to the workpiece boat 40 by the transfer mechanism 76 including the stopper members 94 and the clamp means 96, and of a receiving process. The transfer mechanism 76 is controlled by the transfer control section 103 described above throughout the placing process and receiving process.

A schematic description is next given. In the placing process, the fork main body 78 is moved forward with the wafer W, a workpiece, pressed and clamped by the pressing portion 102 of the clamp means 96 and the stopper member 94. Next, the pressing portion 102 is moved rearward by a predetermined distance to release the clamp of the wafer W immediately before reaching the gap between the ringlike tables 86. Thereafter, the wafer W is placed in the workpiece boat 40.

In the receiving process, the fork main body 78 receives the wafer W thereon in a state where the fork main body 78 is moved forward and the pressing portion 102 of the clamp means 96 is moved rearward to a position not interfering with the ringlike table 86. Thereafter, the fork main body 78 is moved rearward by a predetermined distance and then the pressing portion 102 is moved forward so that the pressing portion 102 and the stopper member 94 press and clamp the wafer W.

Figure 8A:
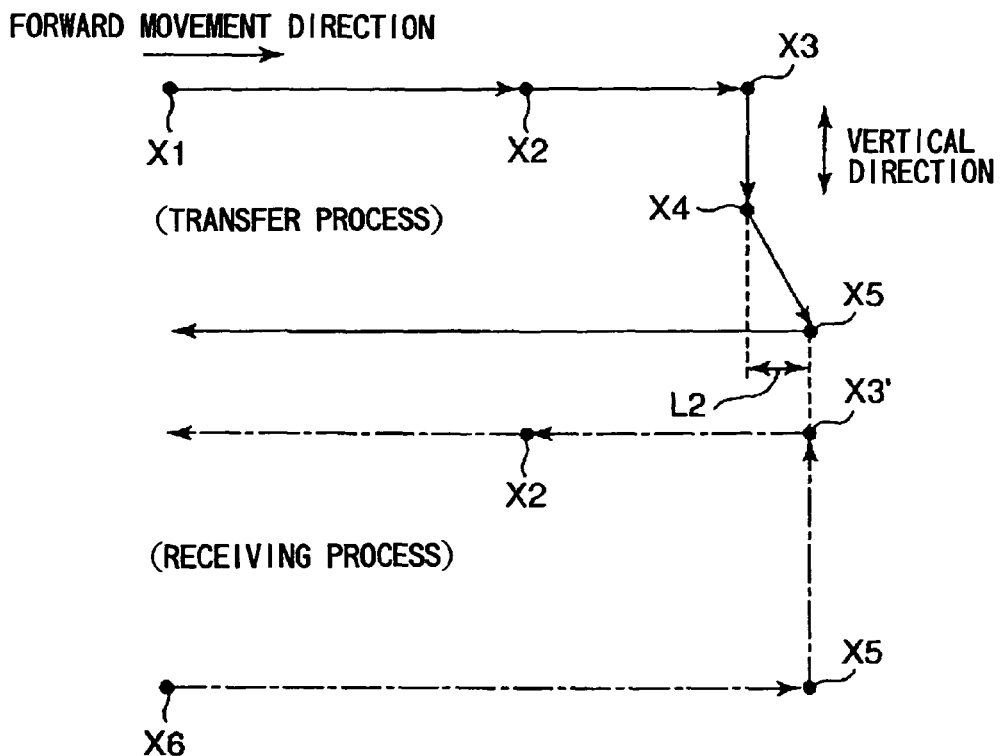
FIGS. 8A and 8B illustrate operative trajectories of an end of an arm main body.
Figure 8B:
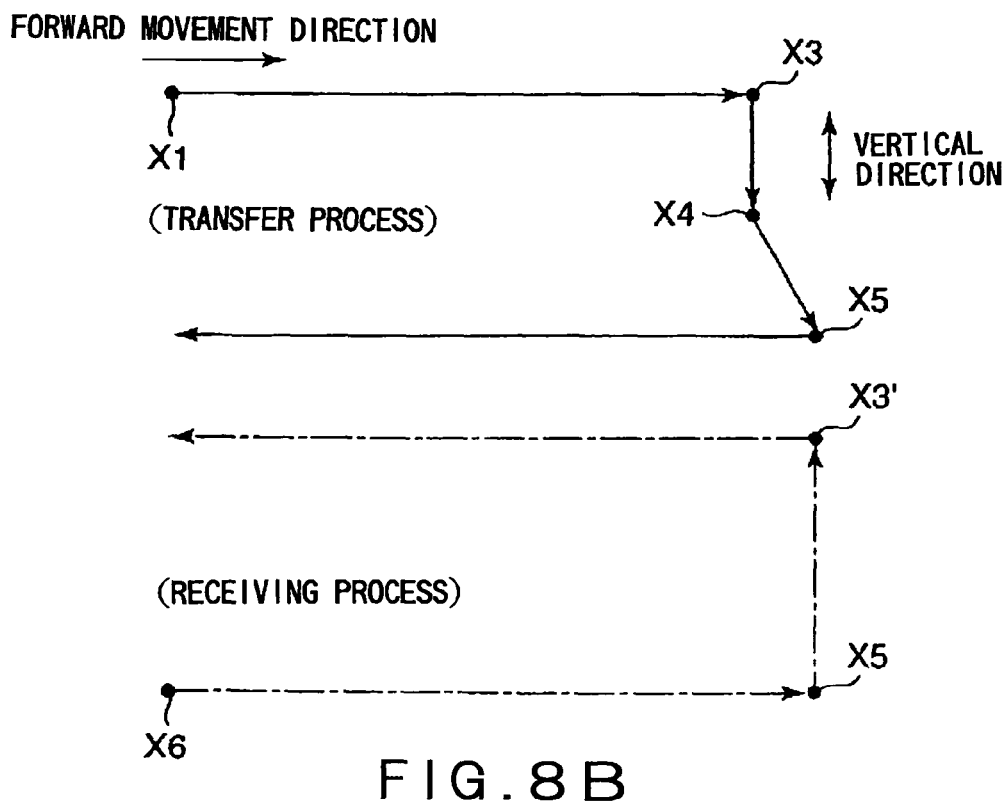

Movement of one point (tip) of the fork main body included in the transfer mechanism 76 is described with reference to FIGS. 8A and 8B. FIG. 8A illustrates the movement of one point (tip) of the fork main body included in the transfer mechanism 76 according to the present embodiment. FIG. 8B illustrates the movement of one point (tip) of the fork main body included in the transfer mechanism according to a comparative example. In FIGS. 8A and 8B, the trajectory of the transfer process is indicated with solid lines whereas the trajectory of the receiving process is indicated with chain lines.

In the transfer process shown in FIG. 8A, first, the transfer mechanism 76 of the present invention puts the wafer W on the fork main body 78 at point X1 and allows the pressing portion 102 of the clamp means 96 to press and clamp the wafer W (a holding step).

In this state, the fork main body 78 is next moved forward toward the workpiece boat 40 at high speed. Subsequently, the fork main body 78 is once stopped at point X2 immediately before the pressing portion 102 reaches the gap between the tables 86 of the workpiece boat 40. Thereafter, the pressing portion 102 is moved rearward, by e.g. about 20 mm, to a position not interfering with the table 86. This releases the clamp of the wafer W.

In addition, the fork main body 78 is slightly moved forward to point X3 which is a placement position (a placing-time approaching step). At this time, since the pressing portion 102 is already moved rearward as described above, it will not collide or interfere with the table 86 even if pitch P2 (see FIG. 3) between the tables 86 is narrow.

Next, the fork main body 78 is lowered to point X4 where the bottom surface of the wafer W put on the fork main body 78 will come into contact with the upper surface of the support claw 88 of the table 86. Further, the fork main body 78 is slightly continuously lowered while being slightly moved forward, thus, shifting to point X5. In this way, the wafer W on the fork main body 78 is transferred onto the support claw 88 (a placing-time transfer step).

The reason for slightly shifting the fork main body 78 obliquely forward and downward from point X4 to point X5 is as below. If the fork main body 78 is vertically lowered from point X4 as it is, since the edge lateral surface of the wafer W is in contact with the lateral surface of the stopper member 94, such a contact portion causes sliding friction, which may probably produce particles or the like. To prevent the production of the particles or the like, the fork main body 78 is slightly shifted obliquely forward and downward as described above. In this case, the horizontal displacement L2 of the fork main body 78 is e.g. about 3.8 mm.

After the placing-time transfer step is completed as described above, the fork main body 78 is next moved rearward at high speed to point X6 so as to be away from the table 86 (a placing-time moving-away step). In this way, the transfer process is completed.

A description is next given of the receiving process according to the present embodiment. The receiving process is basically performed along the course reverse to that of the placing process. The fork main body 78 is moved forward at high speed from point X6 to point X5 which is the foremost position. In this case, the pressing portion 102 on the fork main body 78 is previously moved rearward to a position where not colliding or interfering with the table 86. The rearward movement of the pressing portion 102 is performed immediately before the pressing portion 102 reaches the gap between the tables 86 (a receiving-time approaching step).

Next, the fork main body 78 is lifted to and positioned at point X3'. In this case, point X3' is forwardly offset from the previous point X3 by as slight as a distance L2. In this way, the wafer W put on the table 86 is delivered onto the fork main body 78.

Next, the fork main body 78 is slightly moved rearward by a predetermined distance and positioned at point X2. At point X2, the pressing portion 102 is moved forward to press the wafer W received as described above so that the wafer W is gripped and clamped between the pressing portion 102 and the stopper member 94. The fork main body 78 is further moved rearward at high speed to point X1 so as to be away from the table 86 (a receiving-time moving-away step). In this way, the receiving process is completed.

On the other hand, the placing process and receiving process of a transfer mechanism shown as a comparative example in FIG. 8B have almost the same respective courses as those according to the present invention. However, in the placing process of the comparative example shown in FIG. 8B, since the pitch P1 (see FIG. 13) between the tables is relatively large, the pressing portion is unlikely to interfere with the table. Thus, there is no position corresponding to point X2 in FIG. 8A. Specifically, when the fork 8 (see FIG. 13) is moved forward to point X3 at the end, the pressing portion 12 (see FIG. 13) is moved rearward to release clamping relative to the wafer.

Also in the receiving process in the relative example shown in FIG. 8B, there is no position corresponding to point X2. Specifically, at point X3' as an end, the pressing portion 12 (see FIG. 13) is moved forward to press and clamp the wafer.

As described above, according to the workpiece transfer mechanism 76 of the present embodiment, the pressing portion 102 of the clamp means 96 is controlled not to be inserted into the gap between the tables 86 of the workpiece boat 40 when the semiconductor wafer W, a workpiece, is transferred to the workpiece boat 40. Thus, even if the pitch between the tables 86 of the workpiece boat 40 is small, the pressing portion 102 of the clamp means 96 for clamping the workpiece will not interfere with the workpiece boat 40 and the workpiece transfer operation can be performed with rapidity.

The operation of the transfer mechanism 76 according to the present embodiment is next described in detail with reference to FIGS. 9 through 12. Although the operation of one fork main body 78 is representatively described here, in the actual operation the five fork main bodies 78A-78E are moved in a synchronous and integral manner.

Figure 9:
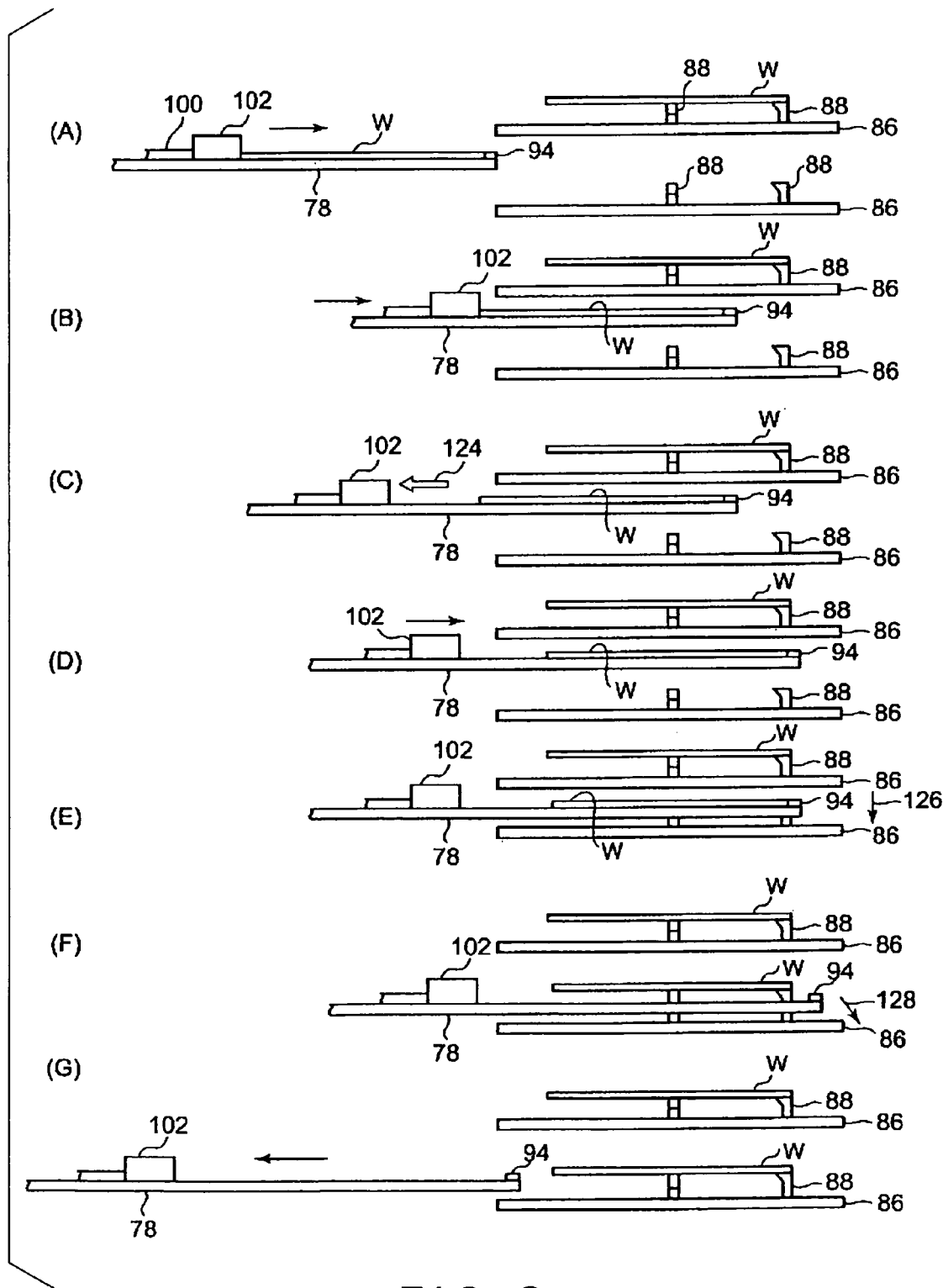
FIGS. 9(A)-9(G) illustrate operation of the transfer mechanism in mounting a semiconductor wafer on the workpiece boat.

The placing process is first described with reference to FIGS. 9 and 10. In the placing process an unprocessed wafer W is placed on the fork main body 78 and is pressed by moving forward the pressing portion 102 of the clamp means 96. In this way, the wafer W is gripped and clamped between the pressing portion 102 and the stopper member 94 (step S1 in FIG. 10). The fork main body 78 is moved forward at high speed toward the table 86 of the workpiece boat 40 with such a clamped state maintained (see FIG. 9(A)).

In this way, the fork main body 78 is made to approach the workpiece boat 40 and inserted into the gap between the tables 86. Thereafter, the fork main body 78 is stopped immediately before the pressing portion 102 collides or interferes with the table 86 (see step S2 in FIG. 10 and FIG. 9(B)). The position of the fork main body 78 at this time corresponds to point X2 in FIG. 8A.

The pressing portion 102 is next moved rearward, by a predetermined distance, e.g. about 20 mm, to a position not interfering with the table 86 as indicated with arrow 124. This releases the clamping of the wafer W (see step S3 in FIG. 10 and FIG. 9(C)). Further, the fork main body 78 is slightly moved forward by a predetermined distance to a placement position (see step S4 in FIG. 10 and FIG. 9(D)). The position of the fork main body 78 at this time corresponds to point X3 in FIG. 8A.

The fork main body 78 is next lowered as shown with arrow 126 to a position where the bottom surface of the wafer W placed thereon will come into contact with the upper surface of the support claws 88 of the table 86. In other words, a first lowering step is performed to lower the fork main body 78 to a height-level of the support claws 88 (see step S5 in FIG. 10 and FIG. 9(E)). The position of the fork main body 78 at this time corresponds to point X4 in FIG. 8A.

Next, the fork main body 78 is slightly lowered while further being slightly moved forward, thus transferring the wafer W on the fork main body 78, onto the support claws 88 of the table 86. In other words, a second lowering step is performed to move the fork main body 78 forward by a slight distance, simultaneously further lowering it (see step S6 in FIG. 10 and FIG. 9(F)). In this case, the fork main body 78 is moved forwardly and obliquely downward as indicated with arrow 128. The position of the fork main body 78 at this time corresponds to point X5 in FIG. 8A. Since the fork main body 78 is moved forward and obliquely downward in this way, sliding friction is not caused between the edge lateral surface of the wafer W and the lateral surface of the stopper member 94. This can suppress production of particles.

Figure 10:
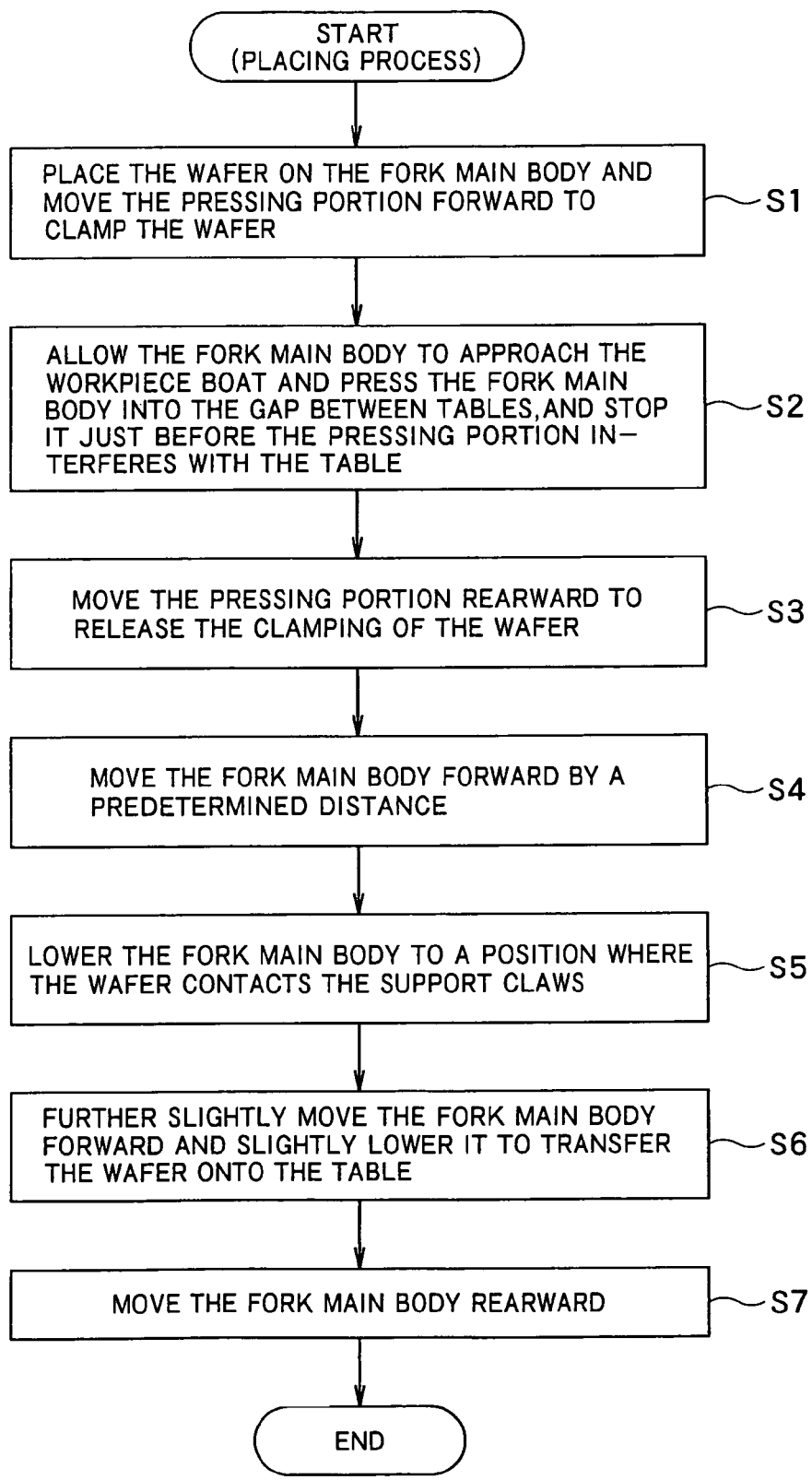
FIG. 10 is a flowchart illustrating operation of a semiconductor wafer placing step.

The fork main body 78 is next moved rearward to be away from the workpiece boat 40 (see step S7 in FIG. 10 and FIG. 9(G)). This completes the transfer process.

Figure 11:
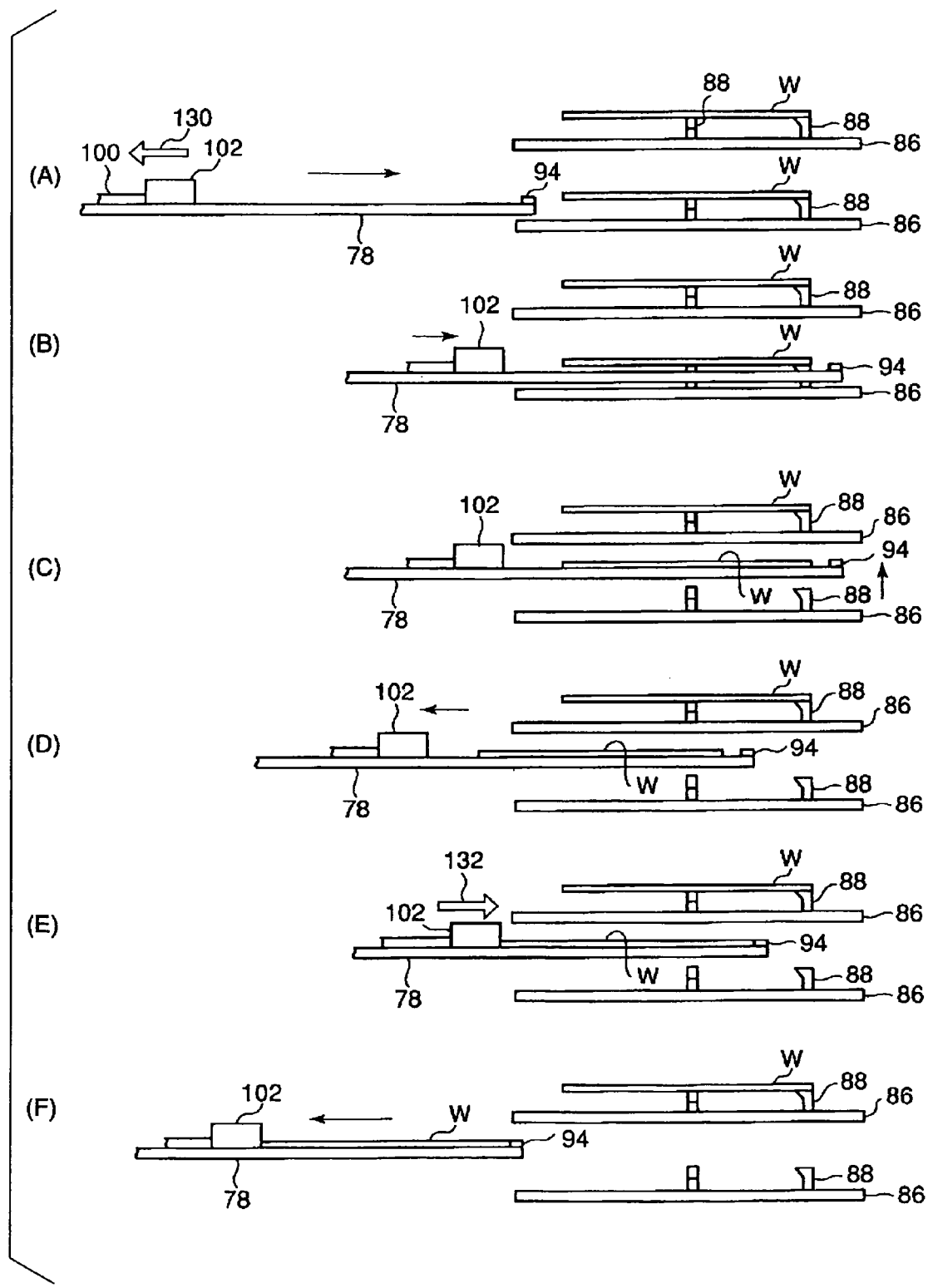
FIGS. 11(A)-11(F) illustrate operation of the transfer mechanism in receiving a semiconductor wafer from the workpiece boat.

Next, the receiving process is described with reference to FIGS. 11 and 12. In the receiving process, the pressing portion 102 located on the fork main body 78 is previously moved rearward as indicated with arrow 130 so as not to interfere with the table 86 (see FIG. 11(A)).

In this state, the fork main body 78 is moved forward and inserted into the gap between the tables 86 and below the wafer W to be received, further being moved forward to the innermost part of the gap (see step S11 in FIG. 12 and FIG. 11(B)). The position of the fork main body 78 at this time corresponds to point X5 in FIG. 8A.

Figure 12:
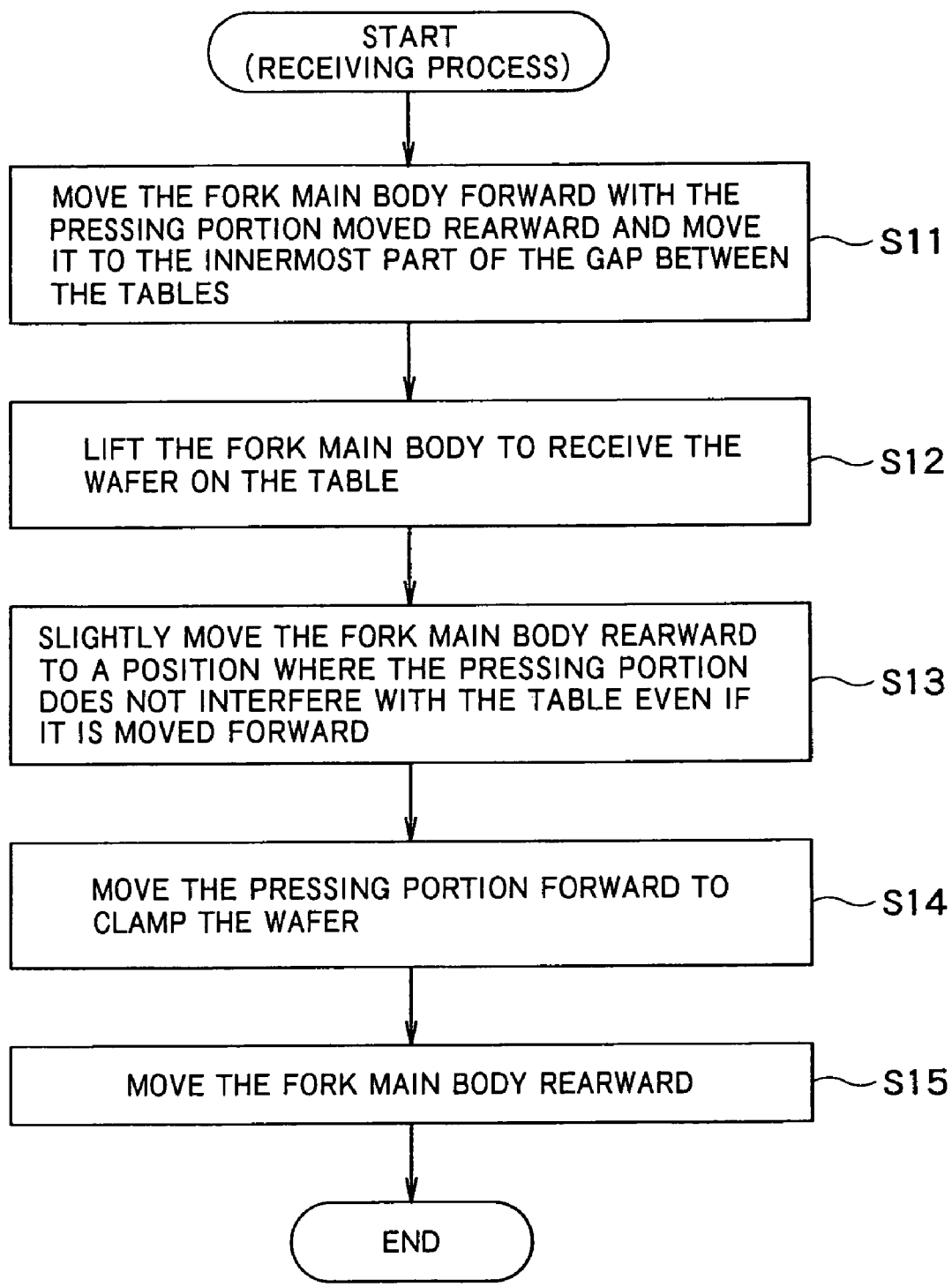
FIG. 12 is a flowchart illustrating operation of a semiconductor wafer receiving step.

The fork main body 78 is next lifted and receives the wafer W that has been supported by the support claws 88 of the table 86 (see step S12 in FIG. 12 and FIG. 11(C)). The position of the fork main body 78 at this time corresponds to point X3' in FIG. 8A.

Next, the fork main body 78 is slightly moved rearward to a position where the pressing portion 102 does not interfere with the table 86 even if it is moved forward (see step S13 in FIG. 12 and FIG. 11(D)). The position of the fork main body 78 at this time corresponds to point X2 in FIG. 8A.

After the fork main body 78 has been moved rearward to such a position, the pressing portion 102 is next moved forward to press the wafer W as indicated with arrow 132. Thus, the pressing portion 102 and the stopper member 94 grip and clamp the wafer W therebetween (see step S14 in FIG. 12 and FIG. 11(E)).

The fork main body 78 is next moved rearward at high speed with the wafer W clamped (see step S15 in FIG. 12 and FIG. 11(F)). This completes the receiving process.

Incidentally, in the embodiment described above, the fork main body 78 is stopped at a portion corresponding to point X2 and at this state the pressing portion 102 is moved forward (the receiving process) or rearward (the placing process). However, the invention is not limited to this. The pressing portion 102 may be moved forward or rearward with the fork main body 78 remaining moved in a range where the pressing portion 102 does not interfere with the table 86.

As described above, according to the workpiece transfer mechanism 76 of the present embodiment, the pressing portion 102 of the clamp means 96 is controlled not to be inserted into the gap between the tables 86 of the workpiece boat 40 when the semiconductor wafer W, a workpiece, is transferred to the workpiece boat 40. Thus, even if the pitch between the tables 86 of the workpiece boat 40 is small, the pressing portion 102 of the clamp means 96 for clamping the workpiece does not interfere with the workpiece boat 40 and the workpiece transfer operation can be performed with rapidity.

The dimensions of the parts and the number of the wafers described in the embodiment are merely exemplified and obviously the present invention is not limited this. The end portion of the fork main body 78 uses the bifurcate one. However, the present invention is not limited to this. A not-bifurcate one may be used.

Further, the embodiment is described here exemplifying the case where $N_2$ gas is used as an inert gas. However, the present invention is not limited to this. A noble gas such as Ar gas, He gas or the like may be used.

The processing system 22 described herein is provided with the storage box conveying area 28 preceding the workpiece transfer area 30. The present invention is not limited to this. The processing system 22 may be configured such that instead of provision of the storage box conveying area 28 this portion is used as an operation area in a clean room where an operator directly places the storage box 26 on the rack 62 of the transfer stage 42.

The embodiment is described exemplifying the semiconductor wafer as a workpiece. However, the present invention is not limited to this. The present invention can be applied to glass substrates, LCD substrates, ceramic substrates or the like.

What is claimed is:

1. A workpiece transfer mechanism for transferring a workpiece to or from a workpiece boat, the workpiece boat having ringlike tables arranged in a longitudinal direction at predetermined pitches to each receive the workpiece placed thereon, the workpiece transfer mechanism comprising:
    a fork main body being movable forward and rearward with the workpiece placed thereon;
    a stopper member provided at an end portion of the fork main body and coming into contact with a circumferential edge of the workpiece;
    clamp means provided on a proximal end side of the fork main body and having a pressing portion, the pressing portion being movable forward and rearward relative to the fork main body along a longitudinal direction of the fork main body and coming into contact with the circumferential edge of the workpiece and pressing the workpiece toward the stopper member for clamping; and
    fork elevating means for lifting and lowering the fork main body along the workpiece boat;
    wherein when the workpiece is transferred to or from the workpiece boat, the fork main body is controlled to be inserted in a gap which is formed between two ringlike tables arranged next to each other in a longitudinal direction and the pressing portion of the clamp means is controlled not to be inserted in the gap.

2. The workpiece transfer mechanism according to claim 1, wherein the end portion of the fork main body is formed to have bifurcate portions and the bifurcate portions are each provided with the stopper member at an end portion thereof.

3. The workpiece transfer mechanism according to claim 1, wherein a plurality of the fork main bodies are vertically parallelized and each provided with the stopper member and with the clamp means.

4. The workpiece transfer mechanism according to claim 1, further comprising:
    a transfer control section for controlling operation of the transfer mechanism;
    wherein the transfer control section controls the fork main body and the clamp means so that the pressing portion of the clamp means is not inserted into the gap between the ringlike tables.

5. A workpiece transfer method of transferring a workpiece to or from a workpiece boat by use of a workpiece transfer mechanism, the workpiece boat having ringlike tables arranged at predetermined pitches to each receive the workpiece placed thereon, the workpiece transfer mechanism including:
    a fork main body being movable forward and rearward with the workpieces placed thereon;
    a stopper member provided at an end portion of the fork main body and coming into contact with a circumferential edge of the workpiece;
    clamp means provided on a proximal end side of the fork main body and having a pressing portion, the pressing portion being movable forward and rearward relative to the fork main body along a longitudinal direction of the fork main body and coming into contact with the circumferential edge of the workpiece and pressing the workpiece toward the stopper member for clamping; and
    fork elevating means for lifting and lowering the fork main body along the workpiece boat,
    the method comprising:
    a placing process for placing the workpiece placed on the fork main body onto the workpiece boat; and
    a receiving process for getting the workpiece placed on the workpiece boat by use of the fork main body, wherein:

in the placing process and in the receiving process, the pressing portion of the clamp means is controlled so as not to be inserted into the gap between the ringlike tables;

the placing process includes:
- a holding step in which the workpiece is pressed by the pressing portion of the clamp means while being placed on the fork main body;
- a placing-time approaching step in which the fork main body is moved forward toward the workpiece boat and the pressing portion is moved rearward to a position not interfering with the table immediately before the pressing portion reaches the gap between the tables of the workpiece boat;
- a placing-time transfer step in which the fork main body is lowered to place the workpiece on the fork main body, onto the table; and
- a placing-time moving-away step in which the fork main body is moved rearward; and the receiving process includes:
- a receiving-time approaching step in which the fork main body is moved forward toward the workpiece boat and the pressing portion is moved rearward to a position not interfering with the table immediately before the pressing portion of the clamp means reaches the gap between the tables;
- a receiving-time transfer step in which the fork main body is lifted to receive thereon the workpiece on the table for transfer; and
- a receiving-time moving-away step in which, when the fork main body is moved rearward by a predetermined distance, the pressing portion is moved forward so that the pressing portion and the stopper member press and clamp the workpiece.

6. The workpiece transfer method according to claim 5, wherein the table is provided thereon with a support claw on which the workpiece is placed, and the placing-time transfer step includes:
- a first lowering step in which the fork main body is lowered to a height-level of the support claw; and
- a second lowering step in which after the first lowering step, the fork main body is moved forward by a slight distance while further being lowered.

7. The workpiece transfer method according to claim 6, wherein a foremost position where the fork main body is moved forward in the receiving-time approaching step of the receiving process is set to coincide with a foremost position the fork main body reaches in the second lowering step of the placing-time transfer step.

8. The workpiece transfer method according to claim 5, wherein the pressing portion of the clamp means is moved forward or rearward with the fork main body stopped.

9. The workpiece transfer method according to claim 5, wherein the pressing portion of the clamp means is moved forward or rearward with the fork main body being moved.

10. A workpiece processing system in which a plurality of workpieces are taken out of a storage box storing the workpieces therein and the workpieces are subjected to heat treatment, the workpiece processing system comprising:
- a longitudinal processing unit for subjecting the workpieces to heat treatment;
- a workpiece transfer area provided at a lower portion of the processing unit and partitioned from the circumference by a partition wall;
- a workpiece boat provided in the workpiece transfer area and having ringlike tables arranged in a longitudinal direction at predetermined pitches to each receive the workpiece placed thereon;
- boat elevating means, provided in the workpiece transfer area, for lifting and lowering the workpiece boat and loading or unloading the workpiece boat into or from the inside of the processing unit; and
- a workpiece transfer mechanism, provided in the workpiece transfer area, for transferring the workpiece between the workpiece boat and the storage box put on a transfer stage provided at the partition wall;

wherein the workpiece transfer mechanism includes:
- a fork main body being movable forward and rearward with the workpieces placed thereon;
- a stopper member provided at an end portion of the fork main body and coming into contact with a circumferential edge of the workpiece;
- clamp means provided on a proximal end side of the fork main body and having a pressing portion, the pressing portion being movable forward and rearward relative to the fork main body along a longitudinal direction of the fork main body and coming into contact with the circumferential edge of the workpiece and pressing the workpiece toward the stopper member for clamping; and
- fork elevating means for lifting and lowering the fork main body along the workpiece boat;

wherein when the workpiece is transferred to or from the workpiece boat, the fork main body is controlled to be inserted in a gap which is formed between two ringlike tables arranged next to each other in a longitudinal direction and the pressing portion of the clamp means is controlled not to be inserted into the gap.

\* \* \* \* \*